United States Patent [19]
Schoofs

[11] Patent Number: 5,338,949
[45] Date of Patent: Aug. 16, 1994

[54] SEMICONDUCTOR DEVICE HAVING SERIES-CONNECTED JUNCTION FIELD EFFECT TRANSISTORS

[75] Inventor: Franciscus A. C. M. Schoofs, Eindhoven, Netherlands

[73] Assignee: U.S. Philips Corporation, New York, N.Y.

[21] Appl. No.: 46,689

[22] Filed: Apr. 12, 1993

[30] Foreign Application Priority Data

Apr. 14, 1992 [EP] European Pat. Off. ........ 92201046.7

[51] Int. Cl.[5] .............................................. H01L 29/80
[52] U.S. Cl. ..................................... 257/269; 257/265;
257/268; 257/272; 257/279
[58] Field of Search ............... 257/263, 265, 269, 272,
257/268, 279, 285, 286

[56] References Cited

U.S. PATENT DOCUMENTS

| | | | |
|---|---|---|---|
| 3,450,963 | 6/1969 | Tsai | 257/263 |
| 3,967,305 | 6/1976 | Zuleeg | 257/265 |
| 4,205,334 | 5/1980 | Nonaka et al. | 257/272 |
| 4,219,828 | 8/1980 | Lardy | 257/272 |
| 4,516,037 | 5/1985 | Shackle | 257/272 |
| 4,816,881 | 3/1989 | Boos et al. | 257/279 |
| 4,937,517 | 6/1990 | Kurashima | 257/272 |
| 4,951,114 | 8/1990 | Lewis | 257/268 |

FOREIGN PATENT DOCUMENTS

| | | | |
|---|---|---|---|
| 2833068 | 2/1979 | Fed. Rep. of Germany | 257/263 |
| 53-139987 | 12/1978 | Japan | 257/272 |
| 57-40983 | 3/1982 | Japan | |
| 112381 | 5/1986 | Japan | |

Primary Examiner—Sara W. Crane
Assistant Examiner—Stephen D. Meier
Attorney, Agent, or Firm—Steven R. Biren

[57] ABSTRACT

A JFET configuration is obtained whose pinch-off voltage can be set by means of mask dimensions, without process changes, and which is at the same time suitable for operation at very low and very high voltages by cascoding of a first JFET with a diffused or implanted channel which is pinched off in lateral direction, parallel to the surface of the semiconductor body, with a second JFET with a high breakdown voltage and a higher pinch-off voltage than the first JFET. To increase the breakdown voltage still further, the combination of the first and second JFET may be further cascoded, without process changes, with a third JFET which has a channel of the conductivity type opposite to that of the first and second JFET.

6 Claims, 2 Drawing Sheets

SEMICONDUCTOR DEVICE HAVING SERIES-CONNECTED JUNCTION FIELD EFFECT TRANSISTORS

BACKGROUND OF THE INVENTION

The invention relates to a semiconductor device comprising a semiconductor body with a layer-shaped region of a first conductivity type which adjoins a surface and is provided with a first junction field effect transistor (JFET) of a type in which the channel can be pinched off in a lateral direction parallel to the surface, which transistor comprises a channel which adjoins the surface and is separated by a pn junction from an adjoining portion of the semiconductor body which forms a gate region of the transistor.

In a junction field effect transistor, referred to as JFET for short hereinafter, current modulation takes place through control of the reverse bias voltage across the pn junction between the gate and the channel, which are of mutually opposing conductivity types. The reverse bias voltage determines the width of the depletion region at the reverse-biased pn junction, and thus the width of the current-passing, not depleted channel. A parameter which is important for various applications is the pinch-off voltage, i.e. the voltage applied to the drain at which the channel at the drain side is depleted over its entire width. Beyond the pinch-off voltage the current through the channel will not or substantially not increase with an increasing voltage between the source and drain, which renders the JFET suitable, for example, as a current source.

In bipolar processes the channel of the JFET is usually formed by an island-shaped portion of an epitaxial layer, for example of the n-type, provided on a substrate of the p-type. The gate comprises a p-type surface zone which is diffused or implanted into the island and which forms the gate electrode, possibly in conjunction with the substrate. The pinch-off voltage is mainly determined, given the doping concentrations of the various zones and regions, by the width of the channel, i.e. by the distance between the substrate and the p-type surface zone. Since this zone is usually formed simultaneously with the base of bipolar transistors, the JFET has a fixed pinch-off voltage at a given thickness of the epitaxial layer, and it is in general not possible to set the pinch-off voltage for a desired value which is different from the said fixed value. Such a limitation in general occurs in vertical configurations in which channel and gate regions lie one above the other.

U.S. Pat. No. 3,450,963 discloses a JFET whose channel is formed by a very narrow island-shaped portion in an epitaxial n-type layer on a p-type substrate. The island, which terminates in two widened portions on either side of the channel forming the source and the drain, is laterally bounded in the epitaxial layer by a deep p-type insulation diffusion which forms the gate electrode of the transistor. The channel is pinched off by depletion regions which extend laterally from the sides of the channel, i.e. in a direction parallel to the surface, into the channel. The pinch-off voltage is determined by the channel width, which in its turn is determined by a dimension on a mask. It is accordingly possible to vary the pinch-off voltage, at least within certain limits, in that this dimension can be adjusted.

A disadvantage of the known transistor is that it is not easy to insulate the gate electrode from the substrate, at least without drastic changes in the process such as the use of double epitaxial layers, which renders the transistor unsuitable for many applications.

When the drain-source voltage increases during operation, the current will again increase strongly owing to avalanche breakdown at the drain-gate electrode junction at a certain voltage beyond the pinch-off voltage. For some applications, for example, in high-voltage ICs which are to be connected to the mains through a rectifier, a high breakdown voltage is required. The use of a voltage divider is not always possible in that case, for example, in those cases in which the device must also be capable of operation at a lower voltage, for example, at a voltage of 12 V supplied by a battery.

SUMMARY OF THE INVENTION

The invention has for its object inter alia to provide a semiconductor device of the kind described in the opening paragraph in which not only the pinch-off voltage is adjustable during the design of the device, given certain process parameters, but which can aim operate in a wide range of voltages, in particular both at comparatively low voltages and at high voltages. Such a device, according to the invention, is characterized in that the channel comprises a surface zone of the second conductivity type provided in the layer-shaped region of the first type, while a channel-limiting surface zone of the first conductivity type with a higher doping concentration than the layer-shaped region forming the gate region is provided in the layer-shaped region, and in that a second junction field effect transistor JFET with a channel of the second conductivity type and a gate region of the first conductivity type is connected in series with the first junction field effect transistor JFET, the second transistor having a higher breakdown voltage and a higher pinch-off voltage than the first transistor.

The invention is based inter alia on the recognition that comparatively lightly doped zones are used in high-voltage IC processes for obtaining a sufficiently high breakdown voltage. Owing to the comparatively light doping, the conductivity of such zones can be readily modulated by a depletion region, so that these zones are suitable for use as a channel of a JFET. The channel can be pinched off by means of more heavily doped regions of the same conductivity type of the layer-shaped region provided on either side of the channel. The pinch-off voltage is adjustable by means of the portions between the said more heavily doped regions, with a possible upper limit being the vertically defined pinch-off voltage, i.e. the voltage at which the channel is pinched off by a depletion region extending in the channel from the channel bottom in a direction transverse to the surface.

As will become apparent hereinafter, the second JFET may be readily realized in combination with the first transistor. To obtain a higher breakdown voltage in a simple manner, without additional process steps, the layer-shaped region with the original, comparatively low background concentration may be used for the gate electrode of the second JFET. As a result, the breakdown voltage in the second JFET is higher than in the first JFET. The lower doping concentration of the gate electrode automatically leads to a higher pinch-off voltage. When a low supply voltage is offered, only the first JFET with low pinch-off voltage will be beyond the pinch-off voltage in the saturation region, whereas the second JFET will at most act as a comparatively lowohmic resistor. When on the other hand a high supply voltage is offered through the drain zone of the second JFET, the second JFET will be pinched off so that a major portion of the high voltage appears as a voltage drop across the channel of the second JFET, which is capable of accommodating these high voltages, unlike the first JFET.

The transistors may be constructed as two separate transistors, each having its own source and drain regions, the drain zone of the first transistor being connected to the source zone of the second transistor through a conductor track. A further embodiment of a semiconductor device according to the invention, which occupies less space than the embodiment described above, is characterized in that the first and the second JFET are constructed in a merged JFET structure with a continuous channel situated between a source region and a drain region of the second conductivity type and with a continuous gate region of the first conductivity type, the doping concentration in a first portion of the gate region adjoining a first portion of the continuous channel bounding the source region being higher than that in a second portion of the gate region adjoining a second portion of the channel situated near the drain region.

The channel of the second JFET may be so narrow that the channel is pinched off in the lateral direction also in this transistor. The pinch-off voltage of this transistor may in that case also be adjusted by means of the channel width. A preferred embodiment, which has the advantage that a maximum pinch-off voltage is obtained for given process parameters, is characterized in that the channel extends over only a portion of the thickness of the layer-shaped region and, for given dimensions, has such a doping concentration that the second portion of the channel is at least substantially pinched off by a depletion region which extends in the channel from the channel bottom in a direction transverse to the surface.

The gate region may be provided with a separate connection through which a voltage which is independent of the source zone can be applied to the gate. A further embodiment, which has the advantage that the combination of the first and the second JFET has only two connections, i.e. for the source and the drain regions, is characterized in that the gate region is connected to the source region. Sufficiently high voltages for many applications can be accommodated with the combination of two transistors. An embodiment of a semiconductor device according to the invention which is suitable for operation at even higher voltages is characterized in that the source region is coupled to the source region of a further transistor of the JFET type whose channel is of the first conductivity type and is formed by a portion of the layer-shaped region of the first conductivity type.

BRIEF DESCRIPTION OF THE DRAWING

The invention will be explained in more detail with reference to several embodiments and the accompanying diagrammatic drawing, in which.

Figure 1:
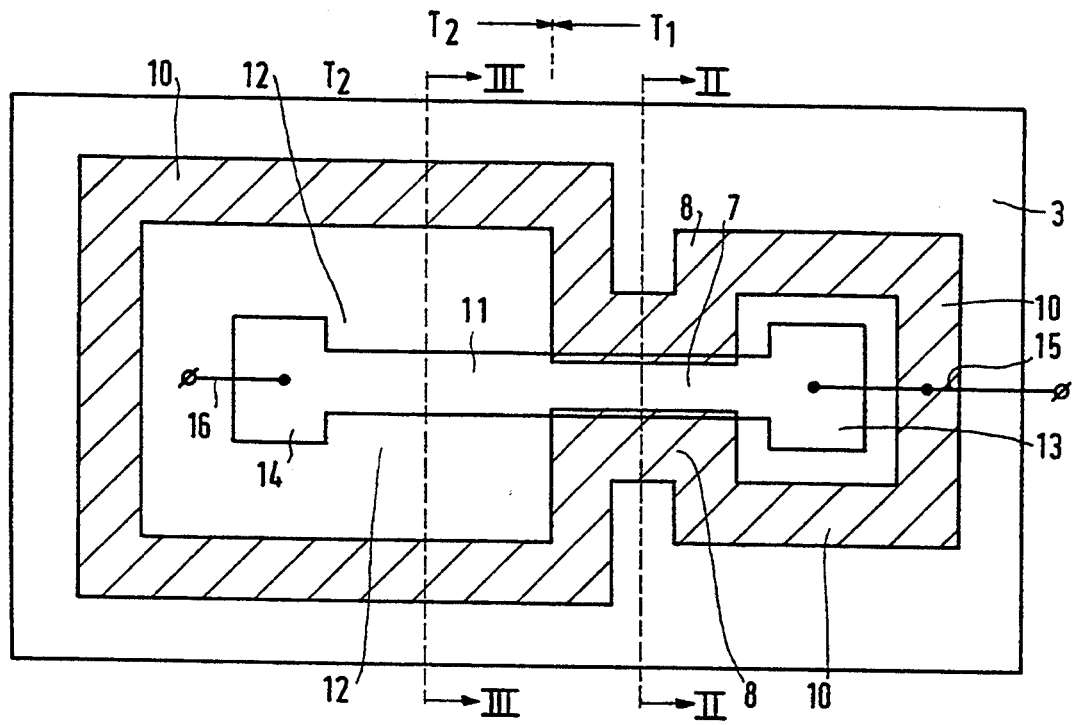
FIG. 1 is a plan view of a portion of a semiconductor device according to the invention.

It is noted that the drawing is merely diagrammatic and that the various components of the device are not drawn true to scale.

DESCRIPTION OF THE PREFERRED EMBODIMENTS

Figure 2:
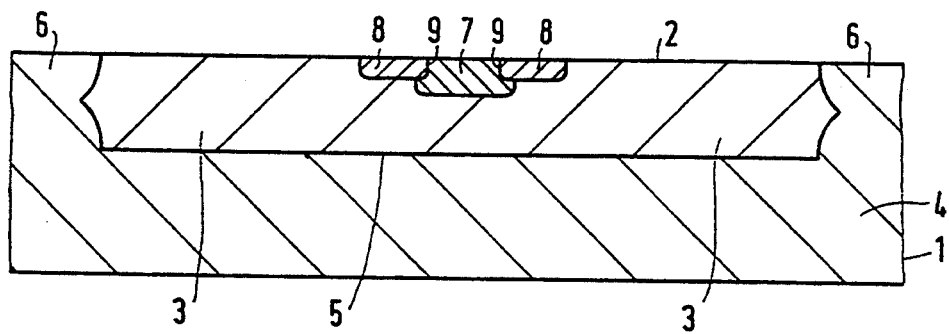
FIG. 2 is a cross-section of this device taken on the line II—II in FIG. 1.
Figure 3:
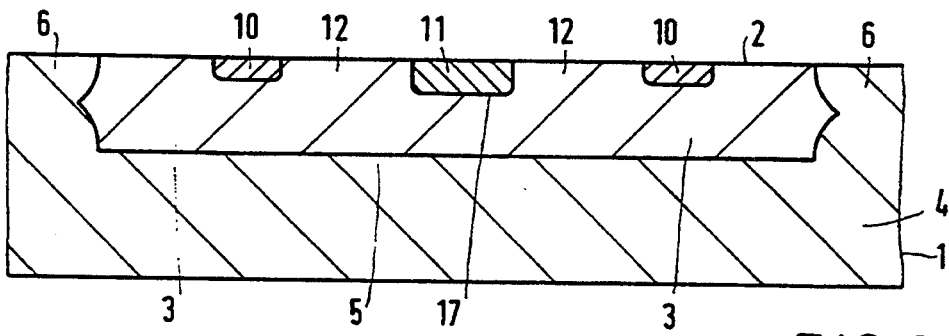
FIG. 3 is a cross-section of this device taken on the line III—III in FIG. 1.

FIGS. 1-3 show a semiconductor device according to the invention comprising a JFET configuration suitable for operation in a wide range of voltages, from a few volts up to a few hundreds of volts. The device may form part of, for example, a high-voltage integrated circuit together with other circuit elements known per se such as diodes, bipolar transistors, MOS transistors or double diffusion MOS transistors (DMOST). These circuit elements are not shown in any detail in the drawing. The device comprises a semiconductor body 1 which in this embodiment is made of silicon, but which obviously may also be made of an alternative suitable semiconductor material such as, for example, GaAs. The body 1 comprises a layer-shaped region 3 of a first conductivity type, in this embodiment of the n-type, adjoining the surface 2. In some embodiments the layer-shaped region 3 may be formed by the entire semiconductor body, but in the present embodiment the region 3 only forms a comparatively thin surface region which is bounded at the lower side by a p-type region 4, referred to as substrate hereinafter. The n-type region 3 and the p-type substrate 4 are separated from one another by the pn junction 5. The layer-shaped region in this embodiment is formed by a layer provided epitaxially on the substrate 4, in which layer an island, which will also be designated with the reference numeral 3 hereinafter, is defined by means of the p-type island insulation zones 6.

A first junction field effect transistor or JFET, designated $T_1$ in FIG. 1 is formed in the island 3. This transistor is of a type in which the channel is not pinched off in vertical direction, as is usual, but in lateral direction parallel to the surface 2. As was described above, such a JFET has among its advantages that the voltage at which the channel is just pinched off, the so called pinch-off voltage, can be adjusted by means of mask dimensions in the design phase of the device without changes in the manufacturing process being necessary. JFET $T_1$ comprises a channel 7 which adjoins the surface 2 and through which a current can be passed from right to left. The channel 7 is laterally bounded by a gate region 8, also referred to as gate for short, which is formed by an adjoining portion of the semiconductor body. The channel 7 and the gate 8 form a pn junction 9 which forms a depletion region in the reverse direction during operation, which region extends in lateral direction further into the channel 7 in proportion as the reverse bias voltage increases. The voltage at which the channel 7 is pinched off is determined, given certain doping concentrations, by the interspacing of the portions of the gate 8 situated on either side of the channel. This interspacing, and thus the pinch-off voltage is set by means of the mask.

According to the invention, the channel 7 is formed by a surface zone of the second conductivity type, in the present embodiment accordingly of the p-type provided in the n-type layer-shaped region or island 3. The gate 8 forms part of a surface zone 10 of the same conductivity type (the n-type) as and with a higher doping concentration than the layer-shaped region 3, which surface zone is also provided in the layer-shaped region 3. A second junction field effect transistor or JFET designated $T_2$ in FIG. 1, is provided in series with transistor $T_1$ and comprises a p-type channel 11 and an adjoining n-type region 12. The transistor $T_2$ has a higher breakdown voltage than transistor $T_1$ and a higher pinch-off voltage, the effects of which will be discussed further below. These higher voltages may be obtained through adaptation of the doping in the gate 12, which in the present case is formed by the n-type island 3 itself with its relatively low concentration.

Although it is perfectly possible, as far as the operation is concerned, to provide the transistors $T_1$ and $T_2$ as separate components in the semiconductor body interconnected by the wiring, the transistors in the present embodiment are merged into one constructional unit in which the channels 7 and 11 fore a continuous p-type channel region which is common to the transistors $T_1$ and $T_2$. The gate regions 8 and 12 of the transistors $T_1$ and $T_2$, respectively, form a continuous n-type region. The JFETs have a common source zone 13 and drain zone 14 provided with a source electrode 15 and a drain electrode 16, respectively. The electrodes are indicated only diagrammatically in FIG. 1. Preferably, the source electrode is integral with the gate regions 8, 12, so that a connection can be dispensed with. The continuous channel 7, 11 adjoins the highly doped gate region 8 in $T_1$, whereas in $T_2$ it adjoins the weakly doped island 3 near the drain. The highly doped n-type zone 10 which aim surrounds the transistor $T_2$ is situated at such a great distance from the channel 11 of $T_2$ that the breakdown voltage and the pinch-off voltage in this transistor are not reduced by the zone 10. Outside the gate region 8, the zone 10 in particular serves as a channel stopper zone which prevents inversion of the conductivity type in the island 3 below the conductor tracks.

The pinch-off voltage of $T_2$ can be adjusted within certain limits by means of the width of the channel 11. In the present embodiment, in which the zone 11 extends over only a portion of the thickness of the island therein and is limited at the lower side by a pn junction 17 which is cut off during operation, the maximum pinch-off voltage is determined by the voltage across this pn-junction, the channel 11 being depleted from the pn junction 17 throughout its thickness up to the surface 2.

In a realized embodiment, the layer-shaped region 3 is formed in an n-type epitaxial silicon layer with a thickness of approximately 20 $\mu$m and a doping of approximately $7 \times 10^{14}$ As atoms per cm$^3$, provided on the p-type silicon substrate 4 whose doping is approximately $1.2 \times 10^{14}$ B atoms per cm$^3$. The island insulation zones 6 are formed in usual manner by diffusion of B from the substrate and from the surface 2. The p-type channel 7, 11 is formed by implantation of B ions with a doping of approximately $1.7 \times 10^{12}$ ions per cm$^2$. The thickness of the zone 7, 11 is approximately 3 $\mu$m. The width of the zone 7, 11 is not critical because the width of the channel of JFET $T_1$ is determined by the n-type gate region 8. A specific value for the width of this channel 7 is, for example, 6 $\mu$m. The n-type gate electrode 8 and the n-type zone 10 acting as a channel stopper are formed through implantation of As ions with a doping of approximately $9 \times 10^{15}$ ions per cm$^2$. The maximum doping concentration of the gate region 8 is approximately $10^{20}$ atoms per cm$^3$ and is accordingly higher than that of the epitaxial layer by a factor $10^5$.

The pinch-off voltage of the configuration described is determined by the pinch-off voltage of $T_1$ and is approximately 3 V at a saturation current of approximately 1 $\mu$A. At low voltages, for example, at a voltage of 7 V between source and drain, the transistor $T_2$ is in the resistance range of the characteristics. Since the resistance of the channel 11 is much lower than that of the pinched-off channel 7, the voltage drop across the channel 11 is only comparatively small. When on the other hand the voltage between the source 13 and the drain 14 becomes high, for example 700 V, the transistor $T_2$ is also pinched off, whereby the voltage drop is for the major part applied to the point of the channel 11 where the channel 11 is pinched off. To carry a current of 1 $\mu$A, the voltage between the gate 12 (700 V) and the drain of $T_2$ sets itself for approximately 50 V. The voltage drop across the channel 7 of $T_1$ is then only approximately 50 V, whereas the voltage drop across the channel 11 is approximately 650 V. This means that also in the case of high voltages at the source 13, at most a comparatively low reverse bias voltage of at most approximately 50 V, well below the breakdown voltage of the pn junction 9 (approximately 100 V), is applied across the pn junction 9. The voltage across the pn junction between the channel 11 of $T_2$ and the island 3 is 700 V. Owing to the low doping level in the island, the breakdown voltage of this pn junction is much higher, of the order of 1000 V, so well above the voltage across the gate-channel junction.

Figure 4:
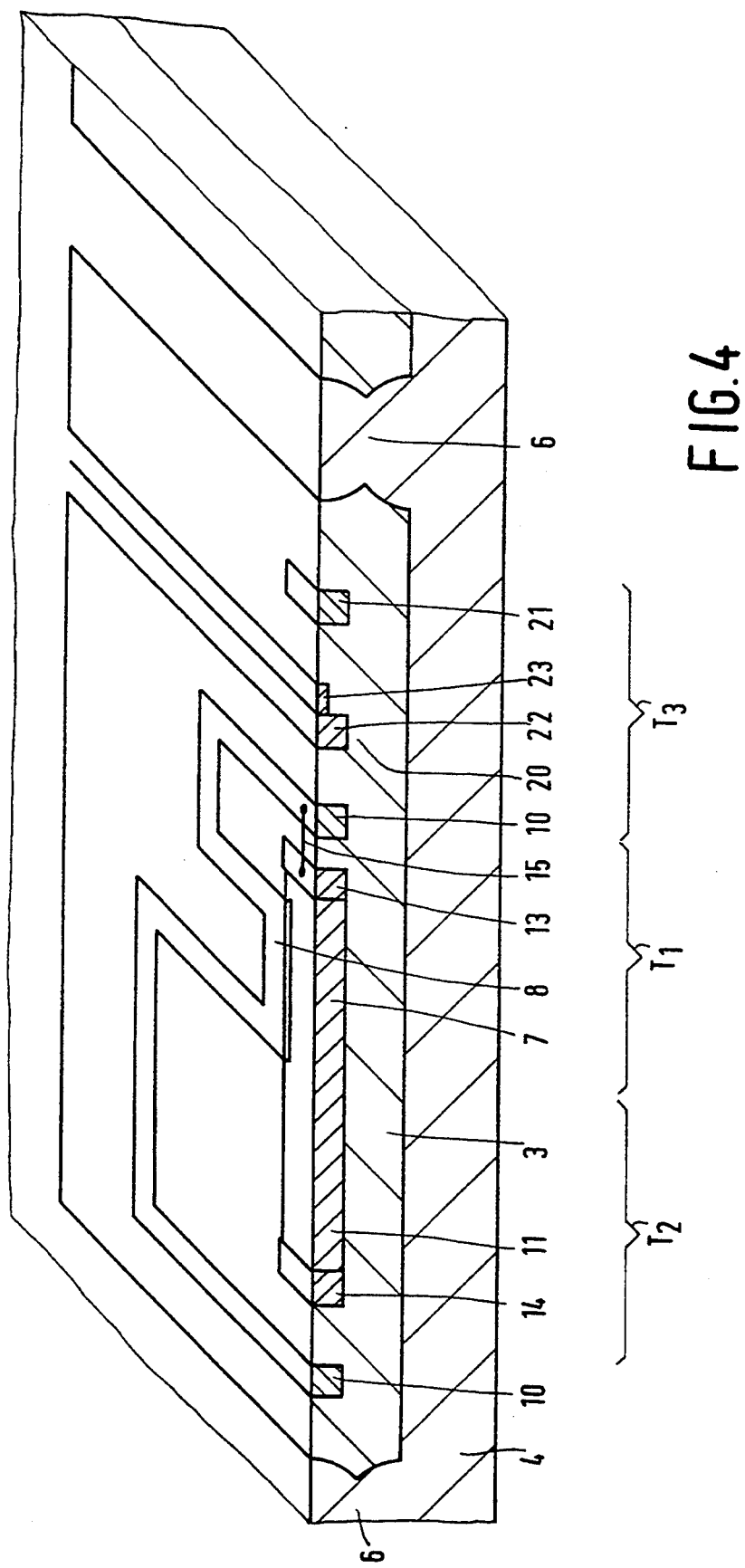
FIG. 4 shows an alternative embodiment of a semiconductor device according to the invention partly in cross-section, partly in perspective view.

FIG. 4 shows an embodiment in which even higher voltages can be reached, partly in cross-section, partly in perspective view. The device comprises the combination of $T_1$ and $T_2$ described above of which the various components have been given the same reference numerals as the corresponding components in the first embodiment. This structure is cascoded with a third JFET, reference $T_3$, whose channel 20 is formed by (a portion of) the epitaxial layer 3. The transistor $T_3$ is accordingly of the n-channel type and comprises a highly doped n+ drain zone 21 which may be connected to the positive supply terminal. The source of $T_3$ is connected to the source zone 13 and the gate 8 of $T_1$ and coincides with the n+ region 10 in the embodiment shown. It will be clear that $T_3$ may also be formed as a separate component in the semiconductor body and may be connected to $T_1$ through a wiring pattern. The channel 20 is pinched off in the vertical direction. In the present embodiment, the gate region of $T_3$ comprises not only the p-type substrate 4 but also a p-type surface zone 22 which is connected to the substrate 4 via the p-type insulation zone 6. The zone 22 may be formed simultaneously with the source and drain zone 13/14. In an alternative embodiment, the gate 22 is provided simultaneously with the surface zone or the buried zone of the insulation region 6. In a further modification, the channel 20 is pinched off from the substrate side (backgate) only. The effect of $T_3$ is identical to that of $T_2$. At voltages up to approximately 100 V, the transistor $T_3$ is in the resistance range under the pinch-off voltage, so that the presence of $T_3$ is only of minor importance. At an increasing voltage at the drain 21, the transistor $T_3$ also reaches the saturated state, at which the channel 20 is just pinched off. At a further increase in the voltage at the drain 21, practically only the voltage at the drain side of the channel 20 will rise, and not or substantially not the voltage at the source side. In this manner the device may be operated at voltages below the breakdown voltage of $T_3$ (>1000 V) which is far in excess of the breakdown voltage of $T_1$, at a current of approximately 1 µA and a pinch-off off voltage of approximately 3 V.

To obtain a high breakdown voltage in $T_3$, the RESURF principle may be advantageously utilized, according to which the layer 3 is depleted over its entire thickness before breakdown takes place. Netherlands Patent Application 8005053 discloses a JFET with an epitaxial channel based on the RESURF principle is described in which a weakly doped p-type surface zone is provided at the surface of the n-layer next to the gate to increase the breakdown voltage. Such a voltage-increasing zone 23 is also provided between the gate 22 and the drain 21. To increase the breakdown voltage still further, one or several similar, mutually separated zones may be provided around the drain 21 as floating rings.

It will be apparent that the invention is not limited to the embodiments given here, but that many more modifications are possible to those skilled in the art. Thus the conductivity types of the various zones and semiconductor regions may be reversed. The JFET configurations described here may be integrated with many other circuit elements known per se in a common semiconductor body, for example, with bipolar transistors, MOS transistors, transistors of the DMOST type, etc.

I claim:

1. A semiconductor device comprising a semiconductor body with a layer-shaped region of a first conductivity type which adjoins a surface and is provided with a first junction field effect transistor (JFET) having a channel which can be pinched off in a lateral direction parallel to the surface, said transistor channel adjoining the surface and being separated by a pn junction from an adjoining portion of the semiconductor body which forms a gate region of the transistor, characterized in that the channel comprises a surface zone of the second conductivity type provided in the layer-shaped region of the first conductivity type, in that a channel-limiting surface zone of the first conductivity type with a higher doping concentration than that of the layer-shaped region forms the gate region and is provided in the layer-shaped region, and in that a second junction field effect transistor (JFET) with a channel of the second conductivity type and a gate region of the first conductivity type is connected in series with the first junction field effect transistor (JFET), the second transistor having a higher breakdown voltage and a higher pinch-off voltage than a breakdown voltage and a pinch-off voltage of the first transistor.

2. A semiconductor device as claimed in claim 1, characterized in that the gate region of the second transistor is formed by the layer-shaped region of the first conductivity type.

3. A semiconductor device as claimed in claim 2, characterized in that the first and the second JFET are constructed in a merged JFET structure with a continuous channel situated between a source region and a drain region of the second conductivity type and with a continuous gate region of the first conductivity type, the doping concentration in a first portion of the gate region adjoining a first portion of the continuous channel bounding the source region being higher than that in a second portion of the gate region adjoining a second portion of the channel situated near the drain region.

4. A semiconductor device as claimed in claim 3, characterized in that the channel extends over only a portion of the thickness of the layer-shaped region and has such a doping concentration that the second portion of the channel is at least substantially pinched off by a depletion region which extends in the channel from the channel bottom in a direction transverse to the surface.

5. A semiconductor device as claimed in claim 3, characterized in that the gate region is connected to the source region.

6. A semiconductor device as claimed in claim 5, characterized in that the source region is coupled to the source region of a further transistor of the JFET type whose channel is of the first conductivity type and is formed by a portion of the layer-shaped region of the first conductivity type.

* * * * *